United States Patent
Ho

(10) Patent No.: US 7,569,444 B2
(45) Date of Patent: Aug. 4, 2009

(54) TRANSISTOR AND METHOD FOR MANUFACTURING THEREOF

(75) Inventor: Park Jeong Ho, Echun-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 196 days.

(21) Appl. No.: 11/302,137

(22) Filed: Dec. 14, 2005

(65) Prior Publication Data
US 2006/0128106 A1 Jun. 15, 2006

(30) Foreign Application Priority Data
Dec. 15, 2004 (KR) .................. 10-2004-0106054

(51) Int. Cl.
*H01L 21/336* (2006.01)
(52) U.S. Cl. .............. 438/197; 438/289; 438/305; 257/E21.433
(58) Field of Classification Search ........... 438/595, 438/197, 291, 305, 306, 289
See application file for complete search history.

(56) References Cited

U.S. PATENT DOCUMENTS

| | | | | |
|---|---|---|---|---|
| 5,668,021 A | * | 9/1997 | Subramanian et al. | 438/282 |
| 5,747,381 A | * | 5/1998 | Wu et al. | 438/624 |
| 5,856,226 A | * | 1/1999 | Wu | 438/291 |
| 6,054,355 A | * | 4/2000 | Inumiya et al. | 438/296 |
| 6,461,904 B1 | * | 10/2002 | Jin et al. | 438/182 |
| 2004/0157383 A1 | * | 8/2004 | Park | 438/197 |

* cited by examiner

*Primary Examiner*—Michael Trinh
(74) *Attorney, Agent, or Firm*—Finnegan, Henderson, Farabow, Garrett & Dunner L.L.P.

(57) ABSTRACT

A transistor includes a gate insulating layer over a semiconductor substrate; a first insulating layer on both sides of the gate insulating layer; first spacers over the first insulating layer and being spaced apart from each other; and a gate conductive plug between the first spacers. A method for manufacturing a transistor includes sequentially depositing a first insulating layer and a second insulating layer over a semiconductor substrate; etching the second insulating layer; implanting impurity ions; depositing and etching a layer of spacer material to form first spacers; removing a first portion of the first insulating layer between the first spacers; depositing a gate insulating layer the place of the first portion of the first insulating layer; forming a gate conductive plug on the gate insulating layer; forming second spacers on sidewalls of the gate conductive plug; and forming a silicide on an upper surface of the gate conductive plug.

15 Claims, 5 Drawing Sheets

TRANSISTOR AND METHOD FOR MANUFACTURING THEREOF

RELATED APPLICATION

This application is based upon and claims the benefit of priority from the prior Korean Patent Application No. 10-2004-0106054, filed Dec. 15, 2004, the entire contents of which are incorporated herein by reference.

BACKGROUND OF THE INVENTION

1. Field of the Invention

The present invention relates to a transistor, and more particularly, to a transistor capable of improving short channel effect, and a method for manufacturing thereof.

2. Description of the Related Art

To achieve a higher integration of a semiconductor devices, the size of the semiconductor devices needs to be reduced. For example, a linewidth of a gate electrode in a metal oxide semiconductor field effect transistor (MOSFET) needs to be reduced, which also reduces the width of the channel of the MOSFET due to lateral diffusion of source/drain regions. However, as a result of reduced channel length, short channel effects increase.

FIG. 1 is a cross-sectional view illustrating a related art method for manufacturing a transistor.

Referring to FIG. 1, a layer of gate insulating material, a polysilicon layer, and a hard mask layer 40 are sequentially formed on a semiconductor substrate 10 in which a field oxide layer (not shown) with a predetermined height is formed in advance.

After hard mask 40 is patterned into a shape of a gate electrode, the polysilicon layer and the layer of gate insulating material are patterned into the shape of hard mask layer 40 by an etch process, to thereby form a gate 50 including gate dielectric 20 and gate electrode 30.

Thereafter, hard mask 40 may be removed and gate spacers 60 are formed on sidewalls of gate 50 by a conventional method. Then, impurities are implanted into the semiconductor substrate 10 using gate 50 and gate spacers 60 as a mask to form source/drain regions 70.

However, according to the related art method for manufacturing the transistor, there is a problem that an additional purchase of a device should be needed in order to fabricate the transistor.

In addition, as the gate length is reduced, a narrow line effect gives rise to problems such as formation of silicide contacts being difficult and gate resistance being higher.

SUMMARY OF THE INVENTION

Accordingly, the present invention is directed to a transistor and a method for manufacturing thereof that substantially obviates one or more problems due to limitations and disadvantages of the related art.

An object of the present invention is to provide a transistor capable of improving short channel effect, and a method for manufacturing thereof.

Another object of the present invention is to provide a transistor capable of reducing a gate resistance with respect to a gate area on which a silicide is formed using a damascene process, and a method for manufacturing thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Consistent with embodiments of the present invention, there is provided a transistor including a gate insulating layer over a semiconductor substrate; a first insulating layer over the semiconductor substrate on both sides of the gate insulating layer; first spacers over the first insulating layer, the first spacers being spaced apart from each other by a predetermined distance; and a gate conductive plug between the first spacers, wherein the first spacers are formed before the gate insulating layer is deposited.

Consistent with embodiments of the present invention, there is also provided a method for manufacturing a transistor that includes sequentially depositing a first insulating layer and a second insulating layer over a semiconductor substrate; etching a predetermined portion of the second insulating layer; implanting impurity ions; depositing a layer of spacer material, and forming first spacers by etching the layer of spacer material; removing a first portion of the first insulating layer exposed between the first spacers by wet etching process; depositing a gate insulating layer in a region where the first portion of the first insulating layer is removed; forming a gate conductive plug on the gate insulating layer; forming second spacers on sidewalls of the gate conductive plug; and forming a silicide on an upper surface of the gate conductive plug.

Consistent with embodiments of the present invention, there is further provided a method for manufacturing a transistor that includes depositing a first insulating layer and a second insulating layer on a semiconductor substrate in sequence, and forming a photoresist pattern on the second insulating layer; etching the second insulating layer by dry etching process using the photoresist pattern as a mask; removing the photoresist pattern after etching the second insulating layer; implanting first impurity ions; forming first spacers by depositing and etching a first layer of spacer material; removing a portion of the first insulating layer using wet etching process; depositing a gate insulating layer on a region where the portion of the first insulating layer is removed; forming a gate conductive plug on the gate insulating layer; removing the second insulating layer using wet etching process; implanting second impurity ions after removing the second insulating layer; forming second spacers by depositing and etching a second layer of spacer material; implanting third impurity ions; and forming a silicide on an upper surface of the gate conductive plug.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
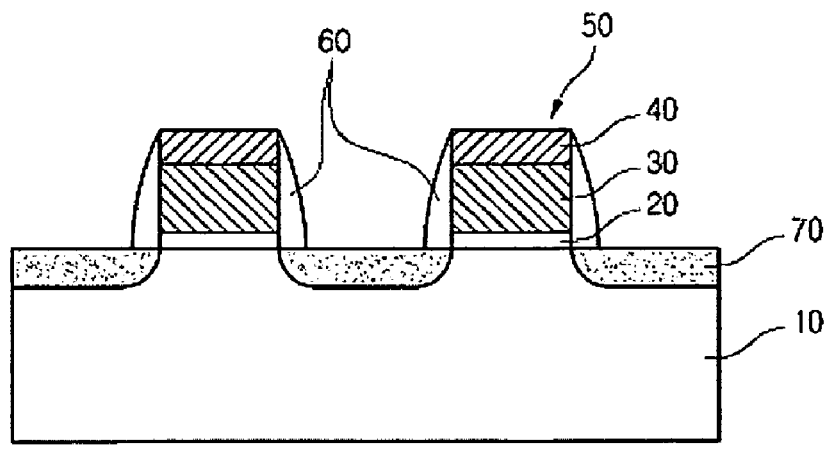
FIG. 1 is a cross-sectional view illustrating a conventional method for manufacturing a transistor.

Reference will now be made in detail to embodiments of the present invention, examples of which are illustrated in the accompanying drawings. The invention may, however, be embodied in many different forms and should not be construed as being limited to the embodiments described herein. Other embodiments through modifications and variations which may be apparent to those skilled in the art also fall within the scope of the present invention.

In the drawings, the thickness of layers and regions are exaggerated for clarity. Like reference numerals in the drawings denote like elements. It is also to be understood that when one layer is said to be "on" another layer or substrate, the one layer can be directly on the other layer or substrate, or intervening layers may also be present.

FIGS. 2 to 11 are cross-sectional views illustrating a method for manufacturing a transistor according to embodiments of the present invention.

Figure 2:
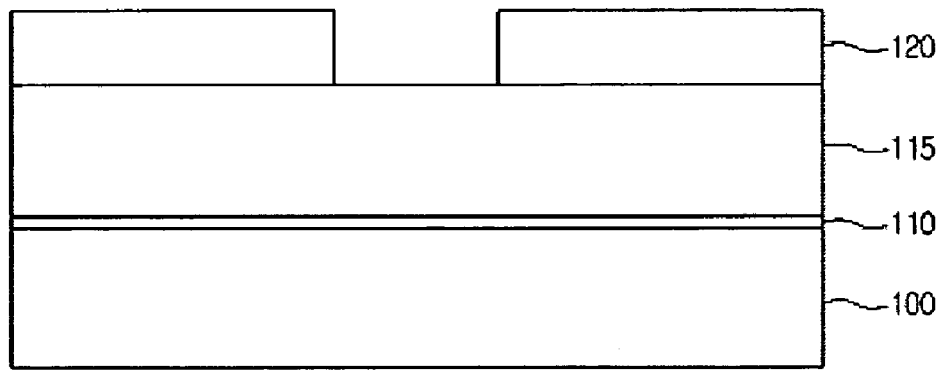
FIGS. 2 to 11 are cross-sectional views illustrating a method for manufacturing a transistor consistent with embodiments of the present invention.

Referring to FIG. 2, after depositing a first insulating layer 110 and a second insulating layer 115 on a semiconductor substrate 100 in sequence, a photoresist pattern 120 is formed on the resultant structure.

First insulating layer 110 acts as an etch stop layer for preventing a surface of semiconductor substrate 100 from being damaged during a subsequent etching process. First insulating layer 110 may be formed using a deposition method such as a chemical vapor deposition (CVD), a low pressure CVD (LPCVD), a plasma enhanced CVD (PECVD), a semi-atmospheric CVD (SACVD), a sputtering, an atomic layer deposition (ALD), or the like. First insulating layer 110 may have a thickness of 20±5 Å so that first insulating layer 110 may act as an effective etch stop layer in later formation of a gate insulating layer and a silicide.

Second insulating layer 115 may be formed of a material which has a different etching rate from that of first insulating layer 110 under the same etchant. For instance, second insulating layer 115 may be formed of tetra ethyl ortho silicate (TEOS), medium temperature deposition of oxide (MTO), undoped silicate glass (USG), or silane ($SiH_4$)-rich oxide. Furthermore, second insulating layer 115 may be formed using a CVD method, a sputtering method, and so forth.

Figure 3:
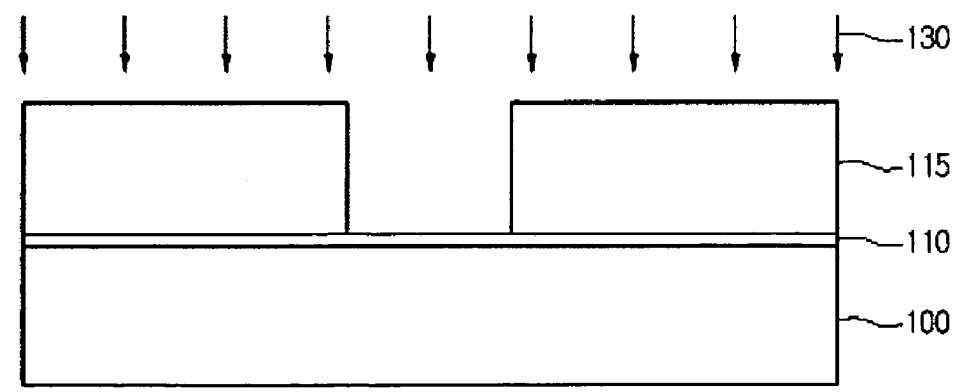

Referring to FIG. 3, second insulating layer 115 is etched using photoresist pattern 120 as a mask layer. Particularly, portions of second insulating layer 115 not masked by photoresist pattern 120 are removed to expose the underlying first insulating layer 110.

Second insulating layer 115 may be etched using a conventional dry etching process. After the etch of second insulating layer 115, photoresist pattern 120 may be removed through an ashing or a strip process.

After photoresist pattern 120 is removed, a first ion implantation process is performed to implant impurity 130 into semiconductor substrate 100, which will contribute to form halo/pocket implants (not shown in FIG. 3) together with subsequent ion implantations.

First insulating layer 110 serves as a buffer for preventing the lattice of semiconductor substrate 100 from being damaged during the formation of the halo/pocket implants.

Figure 4:
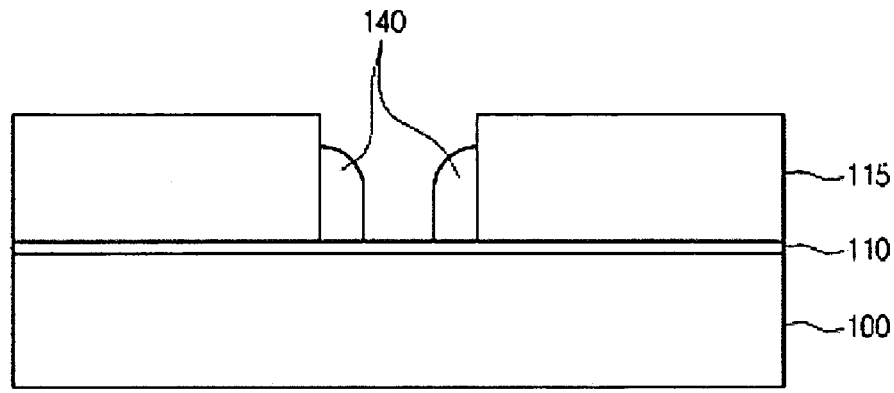

Referring to FIG. 4, a nitride layer (not shown) is deposited on first and second insulating layers 110 and 115 and then etched to form first spacers 140 on sidewalls of second insulating layer 115. Because a gate will be formed in the opening in second insulating layer 115, first spacers 140 serve to reduce a width of the gate and thereby reduce a resistance of the gate.

Figure 5:
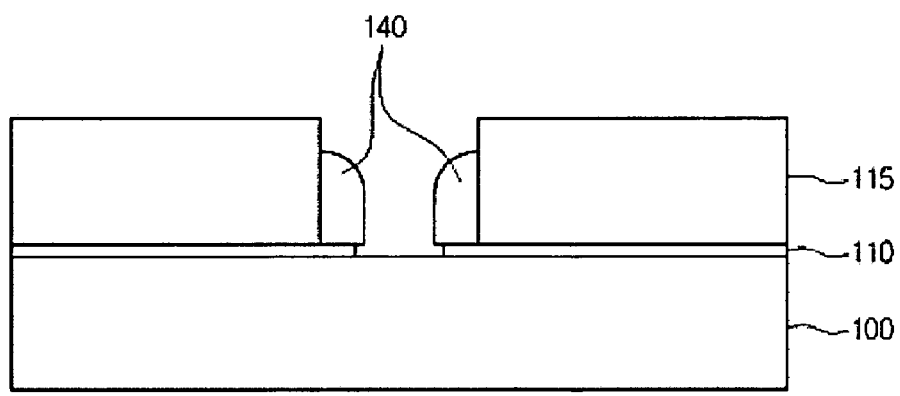

Referring to FIG. 5, the portion of first insulating layer 110 between first spacers 140 is removed using wet etching process. A predetermined portion of first insulating layer 110 under first spacers 140 is also etched so that a gate insulating layer to be formed later may be formed partially under first spacers 140.

Figure 6:
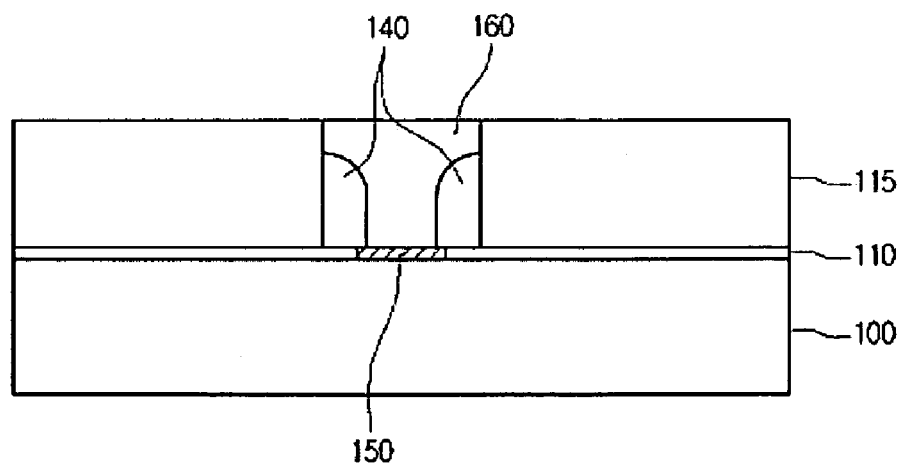

Referring to FIG. 6, a gate insulating layer 150 is deposited in the region of the portion of first insulating layers 110 previously removed. As noted above, because a predetermined portion of first insulating layer 110 under first spacers 140 is also removed, gate insulating layer 150 also extends under first spacers 140. Subsequently, gate insulating layer 150 is planarized using CMP process. Gate insulating layer 150 may have the same thickness as first insulating layer 110.

Thereafter, a gate conductive plug 160 is formed on gate insulating layer 110 and an upper surface of gate conductive plug 160 may be planarized by performing CMP process. Gate insulating layer 150 may be formed using CVD, physical vapor deposition (PVD), or ALD method. Gate conductive plug 160 may be formed of polysilicon.

Figure 7:
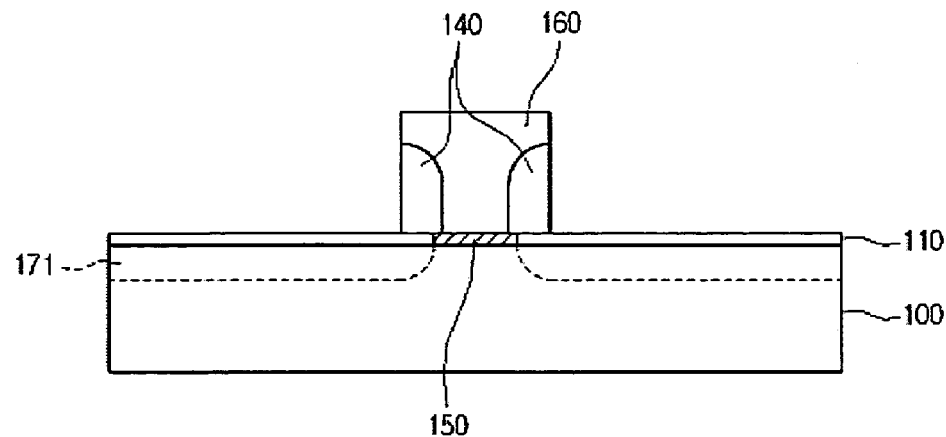

Referring to FIG. 7, second insulating layer 115 is removed by wet etching process using a solution of dilute hydrofluoric acid (HF(49%):$H_2O$) or buffered oxide etchant (BOE, $NH_4F$: HF). Afterwards, a second ion implantation process for lightly doped drain/source (LDD) is performed using first spacers 140 and gate conductive plug 160 as a mask layer, to form shallow source/drain extension regions 171.

Figure 8:
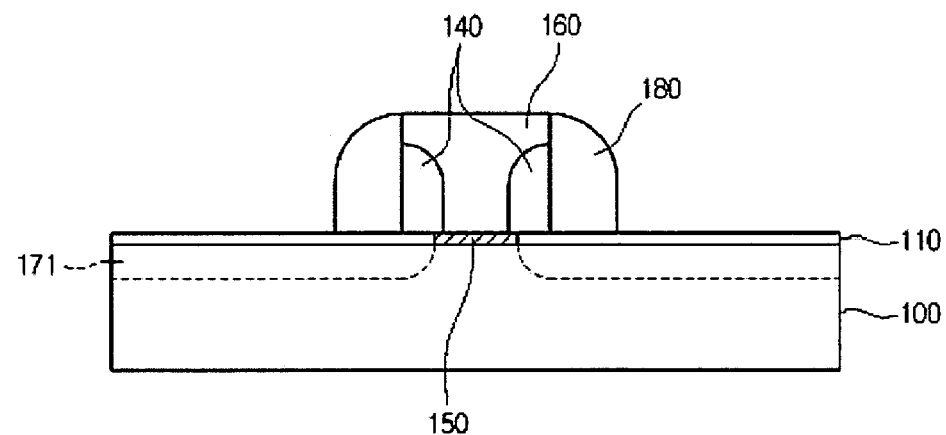

Referring to FIG. 8, after forming shallow source/drain extension regions 171, second spacers 180 are formed on sidewalls of gate conductive plug 160 and first spacers 140. Second spacers 180 may be formed by depositing a layer of nitride or oxide and etching the same.

Figure 9:
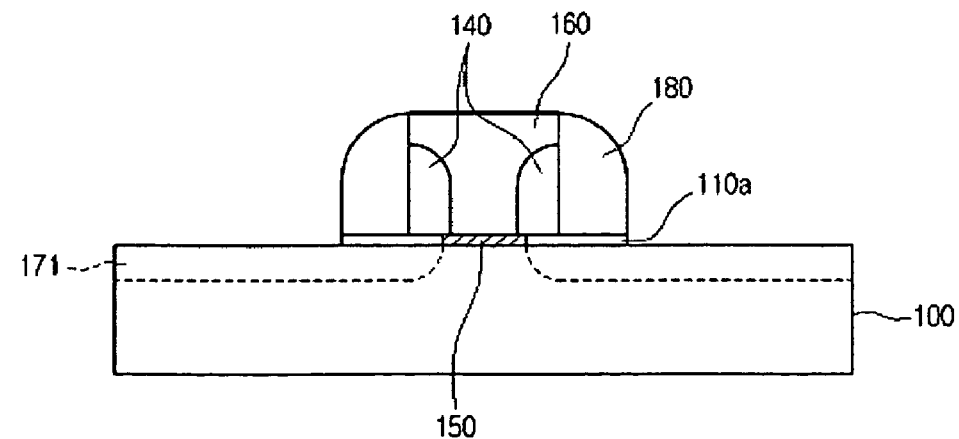

Referring to FIG. 9, portions of first insulating layer 110 exposed on both sides of second spacers 180 and gate conductive plug 160 are removed to expose an upper surface of semiconductor substrate 100. As a result, a portion of first insulating layer 110 remains underneath first spacers 140, second spacers 180, and gate conductive plug 160. The remaining portion of first insulating layer 110 is referred to as third insulating layer 110a. The layer of nitride or oxide for forming spacers 180 and first insulating layer 110 may be etched using the same etchant. In other words, spacers 180 and third insulating layer 110a may be formed through the same etching process.

Figure 10:
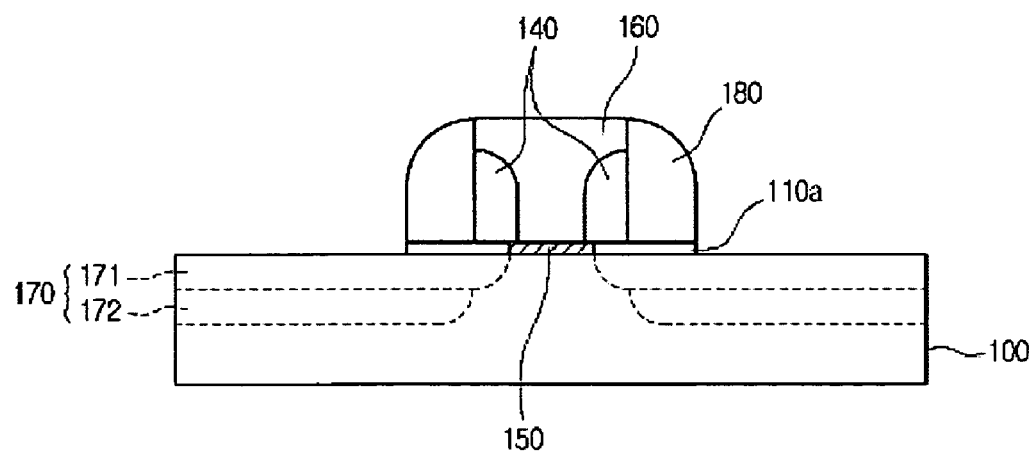

Referring to FIG. 10, a third ion implantation process is performed second spacers 180 as a mask to form deep source/drain regions 172. Therefore, there are formed source/drain regions 170 each with a shallow source/drain extension region 171 and a deep source/drain region 172.

Figure 11:
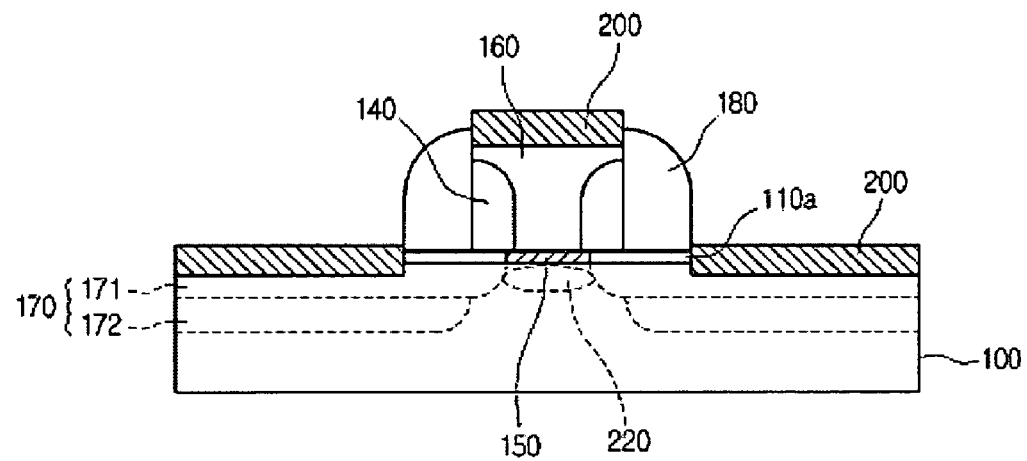

Referring to FIG. 11, a silicide 200 is formed on gate conductive plug 160 and on shallow source/drain extension region 171. Silicide 200 may comprise Ti-silicide, Co-silicide, or Ni-silicide. A thickness of silicide 200 depends on the thickness of the gate insulating layer 150 or the third insulating layer 110a. For example, when third insulating layer 110a has a thickness of 20±5 Å thick, silicide layer 200 may be 100±20 Å thick. FIG. 11 also shows halo/pocket implants 220 formed as a result of the first, second, and third ion implantations.

Figure 12:
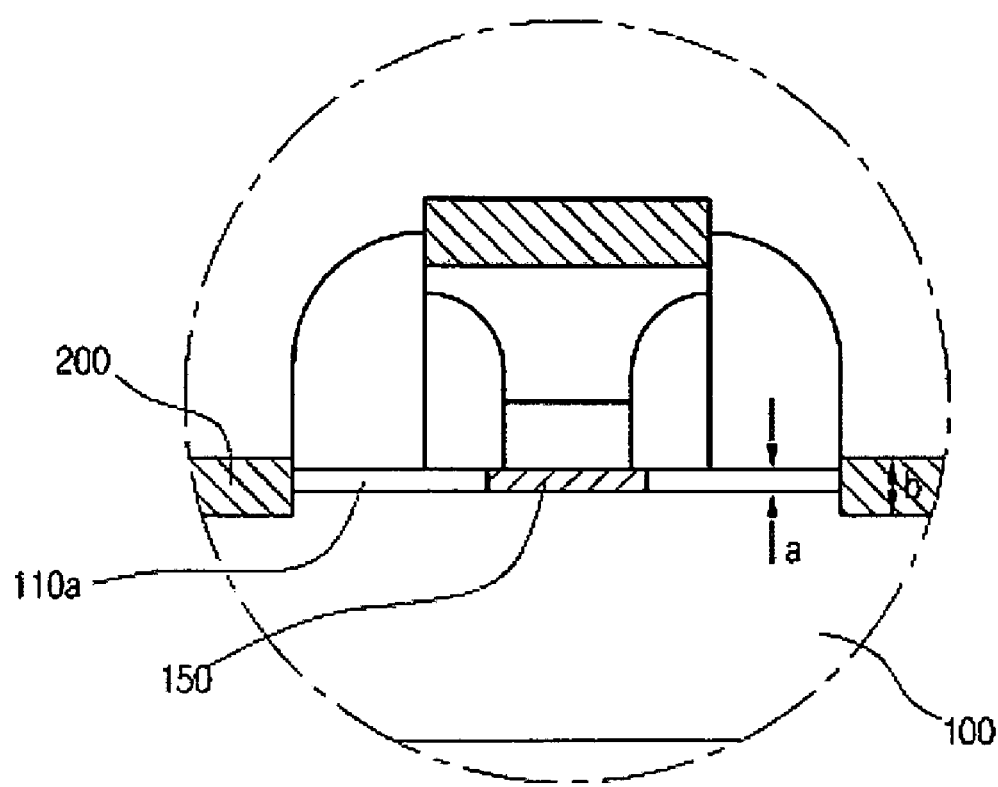
FIG. 12 is an enlarged view of the transistor consistent with embodiments of the present invention.

FIG. 12 is an enlarged view of the transistor according to embodiments of the present invention. Referring to FIG. 12, gate insulating layer 150 and third insulating layer 110a are formed on semiconductor substrate 100. Silicide layer 200 is formed on both sides of second spacers 180 and third insulating layer 110. In one aspect, a ratio between the thickness a of third insulating layer 110a and the thickness b of silicide layer 200 is in a range of 1:4 to 1:6.

Consistent with embodiments of the present invention, silicide layer 200 is formed in coincidence with the fabrication of the transistor in virtue of a damascene process so that it is possible to fabricate the transistor using an existing device without employing additional device. Moreover, since the gate area can be reduced, the present invention is effective for decreasing the gate resistance.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a transistor, the method comprising:
   sequentially depositing a first insulating layer and a second insulating layer over a semiconductor substrate;
   etching a predetermined portion of the second insulating layer;
   implanting impurity ions into the semiconductor substrate;
   depositing a layer of spacer material, and forming first spacers on sidewalls of the second insulating layer by etching the layer of spacer material;
   removing a first portion of the first insulating layer exposed between the first spacers and under a portion of the first spacers by a wet etching process;
   depositing a gate insulating layer in a region where the first portion of the first insulating layer is removed;
   forming a gate conductive plug on the gate insulating layer;
   etching the second insulating layer;
   forming second spacers on sidewalls of the gate conductive plug having the first spacers formed thereon; and
   forming a silicide layer on an upper surface of the gate conductive plug, wherein a thickness ratio between the first insulating layer and the silicide layer is in a range of 1:4 to 1:6.

2. The method according to claim 1, further comprising, after forming the second spacers, etching a second portion of the first insulating layer on both sides of the second spacer to expose an upper surface of the semiconductor substrate.

3. The method according to claim 2, wherein the first insulating layer under the first spacers has a thickness of 20±5 Å.

4. The method according to claim 1, wherein the second insulating layer is formed of a material selected from the group consisting of tetra ethyl ortho silicate (TEOS), medium temperature deposition of oxide (MTO), undoped silicate glass (USG), and silane ($SiH_4$)-rich oxide.

5. The method according to claim 1, wherein the step of implanting the impurity ions forms halo/pocket implants.

6. The method according to claim 5, wherein the implantation of the impurity ions uses the first insulating layer as a buffer layer.

7. The method according to claim 1, wherein the first spacer layers comprise nitride.

8. The method according to claim 1, wherein the gate insulating layer is deposited using a method selected from the group consisting of chemical vapor deposition (CVD), physical vapor deposition (PVD), and atomic layer deposition (ALD).

9. The method according to claim 1, wherein the gate conductive plug comprises polysilicon.

10. The method according to claim 1, further comprising, after depositing the gate insulating layer, removing the second insulating layer by wet etching process.

11. The method according to claim 10, wherein the removing of the second insulating layer is performed by wet etching process using a solution of dilute hydrofluoric acid (HF (49%):$H_2O$) or buffered oxide etchant (BOE, $NH_4F$:HF).

12. The method according to claim 1, wherein the second spacer is formed by depositing a nitride layer or an oxide layer and etching the nitride layer or oxide layer.

13. The method according to claim 1, wherein the silicide is formed by reacting a silicide material selected from the group consisting of Ti, Co, and Ni, with a polysilicon layer.

14. The method according to claim 1, wherein the silicide has a thickness of 100±20 Å.

15. A method for manufacturing a transistor, comprising:
   depositing a first insulating layer and a second insulating layer on a semiconductor substrate in sequence, and forming a photoresist pattern on the second insulating layer;
   etching the second insulating layer by a dry etching process using the photoresist pattern as a mask;
   removing the photoresist pattern after etching the second insulating layer;
   implanting first impurity ions into the semiconductor substrate;
   forming first spacers on sidewalls of the second insulating layer by depositing and etching a first layer of spacer material;
   removing a portion of the first insulating layer exposed between the first spacers and under a portion of the first spacers using a wet etching process;
   depositing a gate insulating layer on a region where the portion of the first insulating layer is removed;
   forming a gate conductive plug on the gate insulating layer;
   removing the second insulating layer using a wet etching process;
   implanting second impurity ions into the semiconductor substrate after removing the second insulating layer;
   forming second spacers on sidewalls of the gate conductive plug having the first spacers formed thereon by depositing and etching a second layer of spacer material;
   implanting third impurity ions into the semiconductor substrate; and
   forming a silicide layer on an upper surface of the gate conductive plug, wherein a thickness ratio between the first insulating layer and the silicide layer is in a range of 1:4 to 1:6.

* * * * *